(12) United States Patent
Kawahito et al.

(10) Patent No.: US 9,307,171 B2
(45) Date of Patent: Apr. 5, 2016

(54) SOLID STATE IMAGE PICK-UP DEVICE, AND PIXEL

(75) Inventors: Shoji Kawahito, Hamamatsu (JP); Isamu Takai, Nisshin (JP)

(73) Assignee: NATIONAL UNIVERSITY CORPORATION SHIZUOKA UNIVERSITY (JP)

( * ) Notice: Subject to any disclaimer, the term of this patent is extended or adjusted under 35 U.S.C. 154(b) by 93 days.

(21) Appl. No.: 14/234,878

(22) PCT Filed: Jul. 25, 2012

(86) PCT No.: PCT/JP2012/068870
§ 371 (c)(1),
(2), (4) Date: Mar. 13, 2014

(87) PCT Pub. No.: WO2013/018623
PCT Pub. Date: Feb. 7, 2013

(65) Prior Publication Data
US 2014/0232917 A1    Aug. 21, 2014

(30) Foreign Application Priority Data
Jul. 29, 2011  (JP) ................................ 2011-167420

(51) Int. Cl.
*H04N 5/374* (2011.01)
*H04N 5/3745* (2011.01)
(Continued)

(52) U.S. Cl.
CPC ........ *H04N 5/3742* (2013.01); *H01L 27/14612* (2013.01); *H01L 31/11* (2013.01); *H04N 5/3594* (2013.01); *H04N 5/3745* (2013.01); *H04N 5/37452* (2013.01)

(58) Field of Classification Search
CPC ........................... H04N 3/1575; H04N 3/1512
USPC ........................................................ 348/303
See application file for complete search history.

(56) References Cited

U.S. PATENT DOCUMENTS

2004/0164321 A1* 8/2004 Dosluoglu .................... 257/197
2010/0187401 A1* 7/2010 Kawahito .................. 250/208.1
(Continued)

FOREIGN PATENT DOCUMENTS

JP    2004-056048    2/2004
JP    2006-41866     2/2006
(Continued)

OTHER PUBLICATIONS

Office Action issued Mar. 31, 2015 in corresponding Japanese Patent Application No. 2011-167420.
(Continued)

*Primary Examiner* — Twyler Haskins
*Assistant Examiner* — Fayez Bhuiyan
(74) *Attorney, Agent, or Firm* — Ostrolenk Faber LLP

(57) ABSTRACT

A pixel 10 includes a photodiode PD which is provided between a first barrier region 21 forming a first potential barrier B1 and a second barrier region 27 forming a second potential barrier B2, a first floating diffusion region F1 which is provided adjacent to the first barrier region 21, and to which a first electric charge generated in the photodiode PD is transferred, and a second floating diffusion region F2 which is provided adjacent to the second barrier region 27, and into which a second electric charge generated in the photoelectric conversion region PD flows, and in which a part of the flowing-in second electric charge is accumulated. The second potential barrier B2 is lower than the first potential barrier B1.

14 Claims, 6 Drawing Sheets

(51) Int. Cl.
*H04N 5/359* (2011.01)
*H01L 31/11* (2006.01)
*H01L 27/146* (2006.01)

(56) References Cited

U.S. PATENT DOCUMENTS

2011/0139963 A1  6/2011  Krymski .................... 250/208.1
2011/0199002 A1* 8/2011  Kamiyama .................. 315/113

FOREIGN PATENT DOCUMENTS

| JP | 2006-50544 | 2/2006 |
| JP | 2009-027480 | 2/2009 |
| JP | 2011-528499 A | 11/2011 |
| WO | WO 2007/083704 A1 | 7/2007 |
| WO | WO 2007/119626 A1 | 10/2007 |
| WO | WO 2010/007594 A1 | 1/2010 |
| WO | WO 2010/013811 A1 | 2/2010 |
| WO | WO 2010/032842 A1 | 3/2010 |

OTHER PUBLICATIONS

PCT/IB/338 Notification of Transmittal of Translation of the International Preliminary Report on Patentability in counterpart International Application No. PCT/JP2012/068870 in English dated Feb. 13, 2014 (6 pages).

International Search Report mailed Aug. 21, 2012 in counterpart International Application No. PCT/JP2012/068870.

Extended European Search Report dated Feb. 26, 2015 in corresponding European Application No. 12819277.0.

Notice of Allowance issued Oct. 27, 2015 in corresponding Japanese Patent Application No. JP 2011-167420.

\* cited by examiner

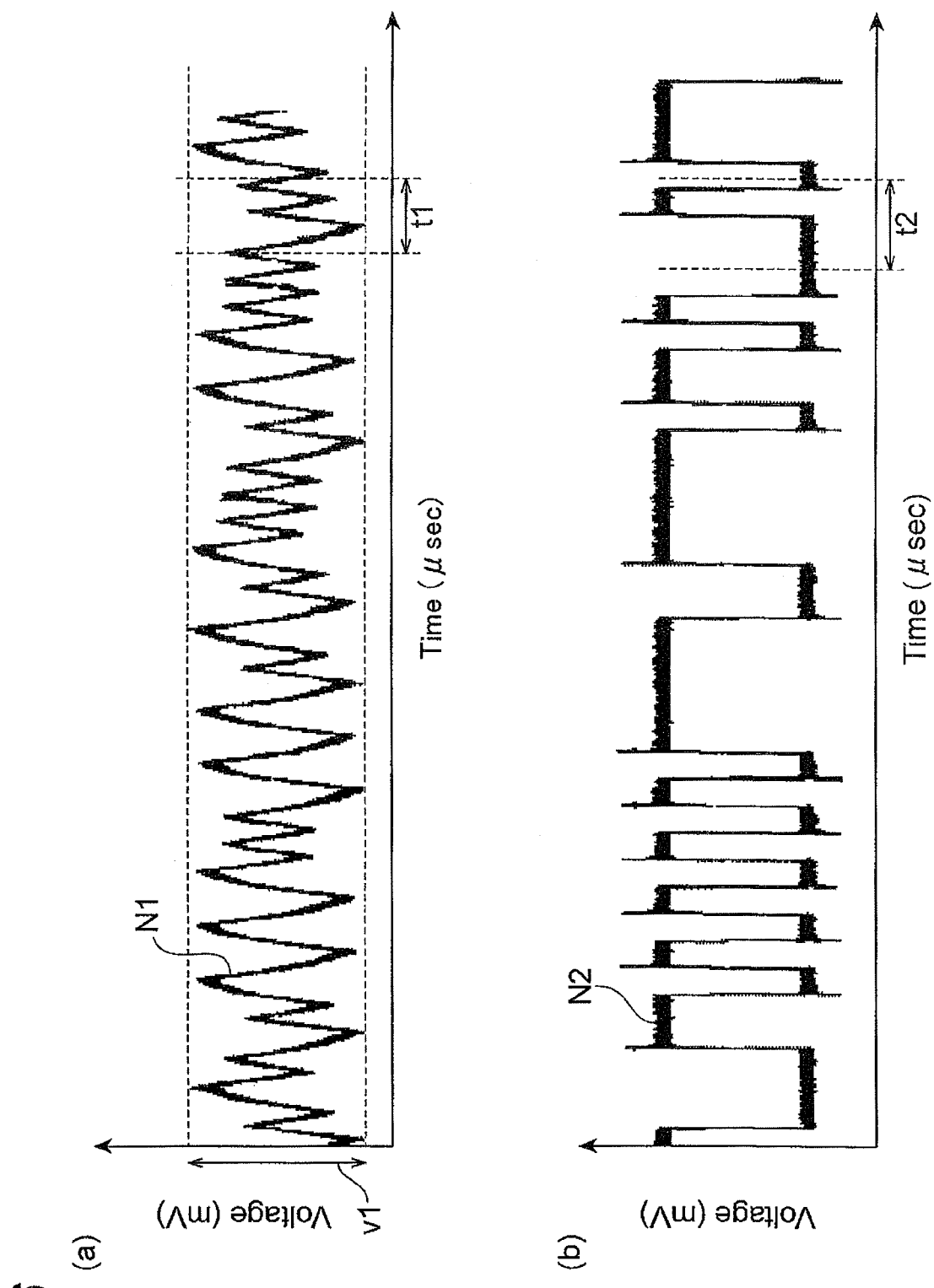

SOLID STATE IMAGE PICK-UP DEVICE, AND PIXEL

CROSS-REFERENCE TO RELATED APPLICATIONS

The present application is a 35 U.S.C. §§371 national phase conversion of PCT/JP2012/068870, filed Jul. 25, 2012, which claims priority to Japanese Patent Application No. 2011-167420, filed Jul. 29, 2011, the contents of both of which are incorporated herein by reference. The PCT International Application was published in the Japanese language.

TECHNICAL FIELD

The present invention relates to a solid state image pick-up device, and a pixel for the solid state image pick-up device.

BACKGROUND ART

LEDs have been increasingly adopted as light sources of headlights and taillights of automobiles, and the like. Because LEDs can be made to flash at high speed, a system performing communication so as to superimpose desired signal information onto flashing of an LED has been researched. For example, an inter vehicle communication system and a road to vehicle communication system using LEDs have been studied.

With respect to these communication systems, an optical communication device is described in Patent Document 1. The optical communication device performs communication by use of light onto which signals are superimposed. This optical communication device includes a solid state image pick-up device including pixels acquiring image signals, and pixels acquiring communication signals. Solid state image pick-up devices are described in Non-Patent Documents 1 and 2. These solid state image pick-up devices are configured to be capable of detecting a communication signal and an image signal. A CMOS solid state image pick-up device is described in Non-Patent Document 3. This solid state image pick-up device is improved in response characteristics with respect to light onto which signals are superimposed. This solid state image pick-up device includes a structure of causing a photodiode to perform an incomplete accumulation operation, and a structure of detecting an electric charge having extremely small capacitance. In accordance with the solid state image pick-up device including these structures, it is possible to achieve a transmission rate of 10 Mbps in an outdoor environment.

CITATION LIST

Patent Literature

Patent Document 1: Japanese Patent Application Laid-Open No. 2009-27480

Non Patent Literature

Non-Patent Document 1: Y. Oike, et. al., "A smart image sensor with high-speed feeble ID-beacon detection for augmented reality system," J. Inst. Image Inf. TV Eng., vol. 58, No. 6, pp. 835-841, 2004.
Non-Patent Document 2: Yamamoto, et. al., "An 'Opt-Navi' System Using a Custom CMOS Image Sensor with a Function of Reading Multiple Region-of-Interests," The Journal of the Institute of Image Information and Television Engineers, 59, 12, pp. 1830-1840, 2005.
Non-Patent Document 3: S. Itoh, et. al., "A CMOS Image Sensor for 10 Mb/s 70 m Range LED-Based Spatial Optical Communication," Dig. Tech. Papers, IEEE Int. Solid-State Circuits Conf., pp. 402-403, 2010.

SUMMARY OF INVENTION

Technical Problem

In the optical communication device in Patent Document 1, pixels acquiring image signals and pixels acquiring communication signals are separate pixels different from each other. Accordingly, light incident into the optical communication device is partially incident into the pixels acquiring image signals, and the remaining light is incident into the pixels acquiring communication signals. An electric charge generated in a pixel to acquire an image signal for acquiring a communication signal cannot be used. Further, an electric charge generated in a pixel to acquire a communication signal for acquiring an image signal cannot be used. Therefore, the electric charge available for acquiring an image signal and a communication signal is decreased. Accordingly, the sensitivity of the optical communication device has likely been reduced.

In consideration of the above-described problem, an object of the present invention is to provide a solid state image pick-up device which is capable of acquiring image signals and acquiring communication signals without reducing its sensitivity, and a pixel for the solid state image pick-up device.

Solution to Problem

An aspect of the present invention is a pixel for a solid state image pick-up device. This pixel includes a photoelectric conversion region which is provided between a first barrier region forming a first potential barrier and a second barrier region forming a second potential barrier, a first floating diffusion region which is provided adjacent to the first barrier region, and to which a first electric charge generated in the photoelectric conversion region is transferred, and a second floating diffusion region which is provided adjacent to the second barrier region, and into which a second electric charge generated in the photoelectric conversion region flows, and in which a part of the flowing-in second electric charge is accumulated. The second potential barrier is lower than the first potential barrier.

In this pixel, when the pixel is irradiated with light having relatively low optical intensity such as light reflected from an object, an electric charge is generated in its photoelectric conversion region. Because the photoelectric conversion region is provided between the first barrier region and the second barrier region, the electric charge is accumulated in the photoelectric conversion region. The accumulated electric charge does not overflow to the second floating diffusion region because of a small quantity of accumulation, and is transferred to the first floating diffusion region. Accordingly, it is possible to acquire a signal based on the light having relatively low optical intensity from the first floating diffusion region. In this pixel, on the other hand, when the pixel is irradiated with light having relatively high optical intensity such as direct light radiated from a light source, a large quantity of electric charge is generated in its photoelectric conversion region. Because the second potential barrier is set to be lower than the first potential barrier, when an electric charge more than the second potential barrier is accumulated in the photoelectric conversion region, the electric charge goes over the second potential barrier, to flow out to the second floating diffusion region. Accordingly, the potential of the second floating diffusion region responds to the irradiation with the light having high optical intensity, and therefore, it is possible to acquire a signal based on the light having high optical intensity from the second floating diffusion region. That is, it is possible to acquire a signal based on the light having relatively low optical intensity and a signal based on the light having relatively high optical intensity from one photoelectric conversion region. Accordingly, it is possible to spatially efficiently use the electric charge for acquiring two types of signals for image detection and communication, thereby suppressing reduction in sensitivity.

Further, the pixel may further include a first output circuit which is connected to the first floating diffusion region, and provides the image signal corresponding to a potential of the first floating diffusion region, and a second output circuit which is connected to the second floating diffusion region, and provides the communication signal corresponding to a potential of the second floating diffusion region. When the electric charge is transferred to the first floating diffusion region, the potential of the first floating diffusion region changes. This change in potential is provided from the first output circuit connected to the first floating diffusion region. In accordance with this, it is possible to acquire an image signal from the pixel. Further, when the electric charge is caused to flow out to the second floating diffusion region, the potential of the second floating diffusion region changes. This change in potential is provided from the second output circuit connected to the second floating diffusion region. In accordance with this, it is possible to acquire a communication signal from the pixel.

Further, the pixel may further include a third barrier region which is provided adjacent to the second floating diffusion region, to form a third potential barrier, and a charge draining region which is provided adjacent to the third barrier region, and to which the second electric charge going over the third potential barrier, to overflow from the second floating diffusion region is discharged. When the photoelectric conversion region is not irradiated with the light having relatively high optical intensity, the flowing-out of the electric charge from the photoelectric conversion region is stopped, and the second electric charge is discharged from the second floating diffusion region to the charge draining region. Accordingly, the quantity of the second electric charge in the second floating diffusion region is decreased. When the quantity of the second electric charge in the second floating diffusion region is decreased, the potential of the second floating diffusion region changes. Accordingly, it is possible to cause the potential of the second floating diffusion region to respond to flashing of the light having high optical intensity, and it is possible to acquire a communication signal corresponding to the flashing.

Further, in the pixel, the third potential barrier may be lower than the second potential barrier. In accordance with this structure, it is possible to appropriately discharge the second electric charge from the second floating diffusion region to the charge draining region.

Further, the pixel may further include a third output circuit whose one end is connected to the charge draining region, and whose other end is connected to the first output circuit. When the pixel is irradiated with the light having relatively high optical intensity, the generated potential is discharged to the charge draining region via the second floating diffusion region. When the second electric charge is discharged to the charge draining region, the potential of the charge draining region changes. It is possible to output this change in potential from the third output circuit to the first output circuit. In accordance with this, it is possible to appropriately detect pixels used for acquiring communication signals.

Further, in the pixel, a switch may be provided between the one end and the other end of the third output circuit. In accordance with this configuration, it is possible to cut off the electric connection between the first output circuit and the second output circuit. In accordance with this, it is possible to prevent a parasitic capacitance from being added to the first output circuit.

Further, in the pixel, the first potential barrier may be controlled by a transfer signal applied to the first barrier region when transferring the first electric charge, and the second potential barrier may be set to a desired fixed value, and the image signal corresponding to the first electric charge transferred to the first floating diffusion region may be output, and the communication signal corresponding to the second electric charge flowing into the second floating diffusion region may be output. In accordance with this configuration, because it is possible to control the first potential barrier by a transfer signal, it is possible to transfer an electric charge generated in the photoelectric conversion region to the first floating diffusion region at desired time intervals. Accordingly, it is possible to acquire an image signal from the pixel. Further, because the second potential barrier is set to a desired fixed value lower than the first potential barrier, it is possible to cause the large quantity of generated electric charge to flow out to the second floating diffusion region. Accordingly, it is possible to acquire a communication signal from the pixel.

Another aspect of the present invention is a solid state image pick-up device. This solid state image pick-up device may include a pixel array having a plurality of pixels which are two-dimensionally arrayed, a readout circuit which reads out an image signal from the pixel array, a receiving circuit which receives a communication signal from the pixel array, and a control circuit which generates control signals for controlling the respective pixels. The pixel may include a photoelectric conversion region which is provided between a first barrier region forming a first potential barrier and a second barrier region forming a second potential barrier, a first floating diffusion region which is provided adjacent to the first barrier region, and to which a first electric charge generated in the photoelectric conversion region is transferred, a second floating diffusion region which is provided adjacent to the second barrier region, and into which a second electric charge generated in the photoelectric conversion region flows, and in which a part of the flowing-in second electric charge is accumulated, a first output circuit which is connected to the first floating diffusion region, and provides the image signal corresponding to a potential of the first floating diffusion region, and a second output circuit which is connected to the second floating diffusion region, and provides the communication signal corresponding to a potential of the second floating diffusion region. The second potential barrier is set to be lower than the first potential barrier, the image signal corresponds to the first electric charge transferred to the first floating diffusion region, and the communication signal corresponds to the second electric charge transferred to the second floating diffusion region.

In this solid state image pick-up device, when the pixel is irradiated with light having relatively low optical intensity such as light reflected from an object, an electric charge is generated in its photoelectric conversion region. Because the photoelectric conversion region is provided between the first barrier region and the second barrier region, the electric charge is accumulated in the photoelectric conversion region. The accumulated electric charge is transferred to the first floating diffusion region. Accordingly, it is possible to acquire an image signal based on the light having relatively low optical intensity via the first output circuit. On the other hand, in this solid state image pick-up device, when the pixel is irradiated with light having relatively high optical intensity such as direct light radiated from a light source, a large quantity of electric charge is generated in its photoelectric conversion region. The second potential barrier is set to be lower than the first potential barrier. Therefore, when an electric charge more than the second potential barrier is accumulated, the electric charge goes over the second potential barrier, to flow out to the second floating diffusion region. Accordingly, the potential of the second floating diffusion region responds to the irradiation with the light having relatively high optical intensity, and therefore, it is possible to acquire a communication signal based on the light having relatively high optical intensity via the second output circuit. In accordance with this, it is possible to acquire two types of signals of an image signal and a communication signal from one photoelectric conversion region. Accordingly, it is possible to spatially efficiently use the electric charge generated in the photoelectric conversion region for acquiring signals, thereby suppressing reduction in sensitivity.

Further, the solid state image pick-up device may further include a search circuit which reads out a discriminating signal from the pixel array, to search the pixel into which light onto which a signal is superimposed is incident based on the discriminating signal. The pixel may include a third barrier region forming a third potential barrier, a charge draining region which is provided adjacent to the third barrier region, and to which the second electric charge going over the third potential barrier, to overflow from the second floating diffusion region is discharged, and a third output circuit whose one end is connected to the charge draining region, and whose other end is connected to the first output circuit, and the search circuit may read out the discriminating signal corresponding to the second electric charge which is discharged to the charge draining region via the third output circuit and the first output circuit. In accordance with this configuration, when the solid state image pick-up device is irradiated with the light having relatively high optical intensity, an electric charge generated in the photoelectric conversion region is discharged to the charge draining region via the second floating diffusion region. When the electric charge is discharged to the charge draining region, the potential of the charge draining region changes. This change in potential is read out as a discriminating signal by the third output circuit. The discriminating signal is input to the search circuit. It is judged whether or not the light is light onto which a communication signal is superimposed based on this discriminating signal, by the search circuit. In accordance with this, it is possible to specify a position of a pixel which has received the light onto which the communication signal is superimposed.

Advantageous Effects of Invention

In accordance with the above-described solid state image pick-up device and the pixel for the solid state image pick-up device, it is possible to acquire an image signal and a communication signal without reducing its sensitivity.

BRIEF DESCRIPTION OF DRAWINGS

FIG. 6 are diagrams showing an example of a communication signal output from the solid state image pick-up device.

DESCRIPTION OF EMBODIMENTS

Hereinafter, embodiments of a solid state image pick-up device and a pixel which is built in the solid state image pick-up device will be described in detail. In addition, the same components are denoted by the same reference signs in the description of the drawings, and overlapping descriptions will be omitted.

Figure 1:
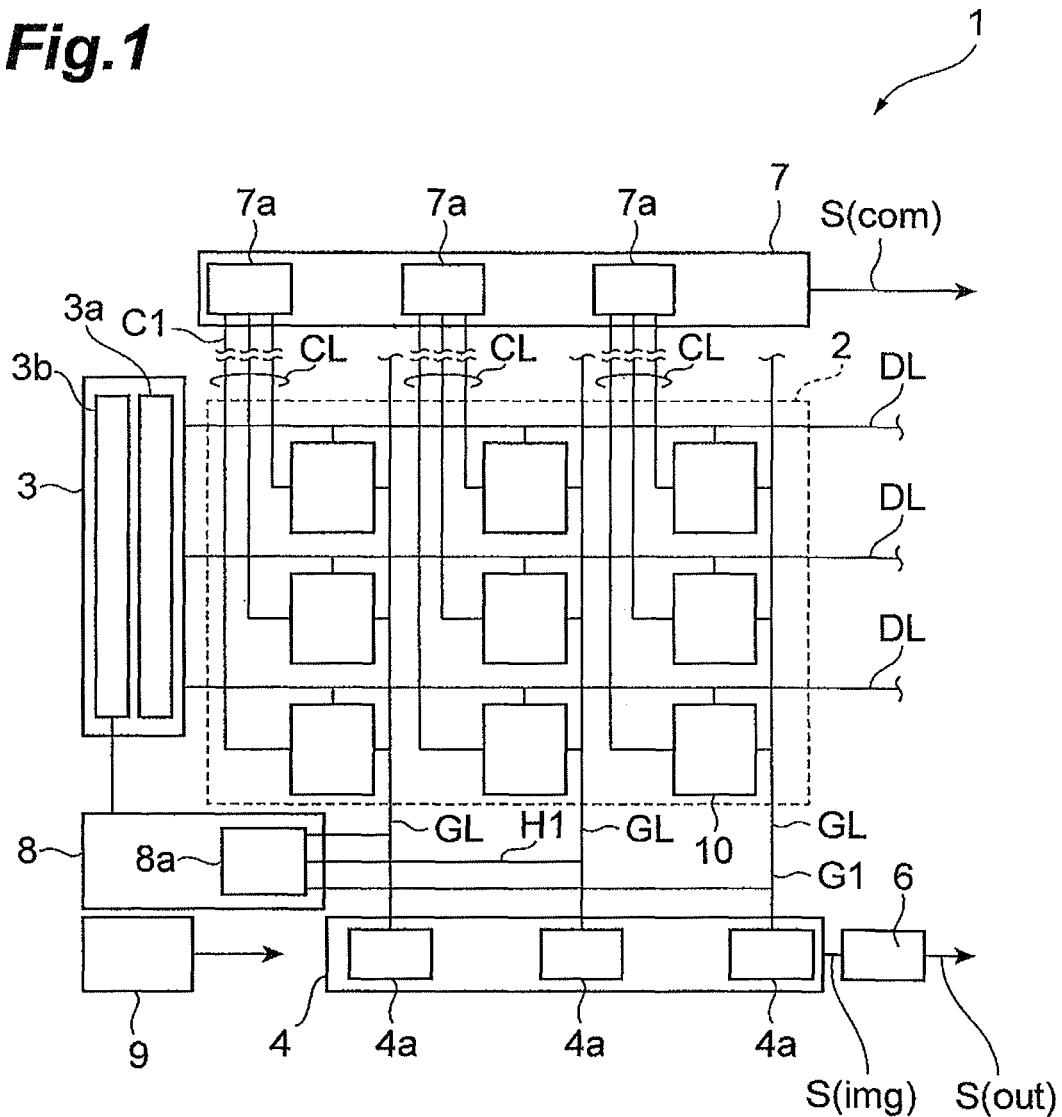
FIG. 1 is a block diagram showing a configuration of a solid state image pick-up device which is a two-dimensional image sensor.

FIG. 1 is a block diagram showing a configuration of a solid state image pick-up device 1 which is a two-dimensional image sensor. The solid state image pick-up device 1 includes a pixel array 2, a control circuit 3, an image signal processing circuit 4, a signal processing circuit 6, a communication signal processing circuit 7, a search circuit 8, and a timing generating circuit 9.

The pixel array 2 includes a plurality of pixels 10 which are two-dimensionally arrayed. An image signal line GL, a communication signal line CL, and a driving line DL are connected to the pixel 10. In addition, FIG. 1 shows a configuration in which the nine pixels 10 are arrayed in the pixel array 2. However, the number of the pixels 10 arrayed in the pixel array 2 is not limited to nine. The number of the pixels 10 arrayed in the pixel array 2 may be 9 or more, and may be 9 or less.

Figure 2:
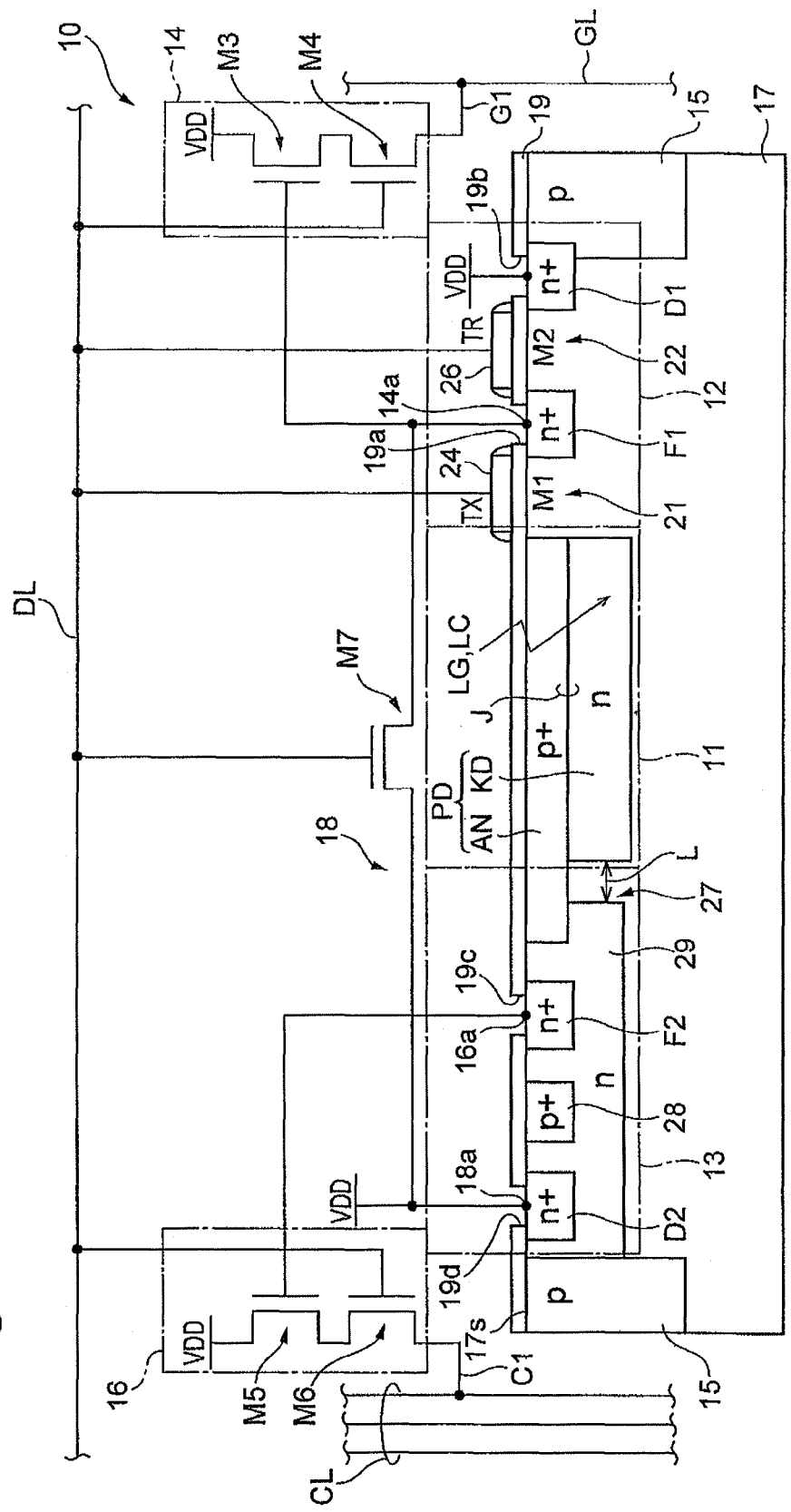
FIG. 2 is a diagram showing an example of a structure of a pixel for the solid state image pick-up device.

FIG. 2 is a diagram showing an example of a structure of the pixel 10 built-in the solid state image pick-up device 1. The pixel 10 includes a photoelectric conversion region 11, an image signal readout section 12, a communication signal readout section 13, a first output circuit 14, a second output circuit 16, and a third output circuit 18. The pixel 10 includes a semiconductor substrate 17 formed of, for example, a p-type semiconductor. An insulating layer 19 is provided on a principal surface 17s of the semiconductor substrate 17.

The photoelectric conversion region 11 is provided between the image signal readout section 12 and the communication signal readout section 13. The photoelectric conversion region 11 receives an image signal light LG, to generate an electric charge. The image signal light LG is, for example, image light expressing an object image reflected from an object. The photoelectric conversion region 11 receives a communication signal light LC, to generate an electric charge. The communication signal light LC is light onto which a predetermined communication signal is superimposed. The communication signal light LC is, for example, direct light which is generated by flashing an LED, to be directly incident into the pixel 10.

The photoelectric conversion region 11 includes a buried photodiode PD. The buried photodiode PD is provided so as to be buried in the principal surface 17s of the semiconductor substrate 17. The photodiode PD includes a relatively-shallow p+ type semiconductor region AN which is provided in the principal surface 17s of the semiconductor substrate 17, and a relatively-deep n-type semiconductor region KD which is provided immediately below the p+ type semiconductor region AN. The p+ type semiconductor region AN and the n-type semiconductor region KD form a p-n junction J. Because this p-n junction J is located so as to be buried in the semiconductor substrate 17, the dark current of the photodiode PD is extremely low. The p+ type semiconductor region AN is connected to a grounding wire via the semiconductor substrate 17. The n-type semiconductor region KD is in common use with the source portion of a transistor M1, thereby connecting the photodiode PD to the transistor M1.

The image signal readout section 12 is provided adjacent to the photoelectric conversion region 11. The image signal readout section 12 outputs an image signal G1 to the image signal line GL via the first output circuit 14. The image signal G1 corresponds to the electric charge transferred from the photoelectric conversion region 11 to a first floating diffusion region F1.

The image signal readout section 12 includes a first barrier region 21, the first floating diffusion region F1, a fourth barrier region 22, and a first discharge region D1. The first barrier region 21 is provided adjacent to the photodiode PD. The first floating diffusion region F1 is provided adjacent to the first barrier region 21. The first barrier region 21 is formed of a p-type semiconductor, to form a first potential barrier. A gate electrode 24 is connected to the surface of the first barrier region 21 via the insulating layer 19. In accordance with this configuration, the first potential barrier is controlled by a transfer signal TX applied to the first barrier region when transferring the electric charge. The first floating diffusion region F1 is formed of an n+ type semiconductor. An input terminal 14a of the first output circuit 14 is connected to the surface of the first floating diffusion region F1. In accordance with this configuration, the transistor M1 is formed. The n-type semiconductor region KD of the photodiode PD corresponds to the source portion of the transistor M1. The first floating diffusion region F1 of the photodiode PD corresponds to the drain portion of the transistor M1. The gate portion of the photodiode PD corresponds to the gate electrode 24 of the transistor M1. By connecting the gate electrode 24 to the driving line DL, the transistor M1 is operated as a transfer switch for transferring the electric charge from the photoelectric conversion region 11. That is, the first potential barrier is controlled by a transfer signal TX applied to the first barrier region 21 via the gate electrode 24. In accordance with this, an electric charge generated in the photodiode PD is, as first electrodes, transferred to the first floating diffusion region F1.

The fourth barrier region 22 is provided adjacent to the first floating diffusion region F1. The first discharge region D1 is provided adjacent to the fourth barrier region 22. The fourth barrier region 22 is formed of a p-type semiconductor, to form the fourth potential barrier. A gate electrode 26 is connected to the fourth barrier region 22 via the insulating layer 19. The first discharge region D1 is formed of an n+ type semiconductor, and a high-potential power source VDD is connected to its surface. In accordance with this configuration, the transistor M2 is formed. The first floating diffusion region F1 corresponds to the source portion of the transistor M2. The first discharge region D1 corresponds to the drain portion of the transistor M2. The gate electrode 26 corresponds to the gate portion of the transistor M2. The driving line DL is connected to the gate electrode 26. In accordance with this configuration, the transistor M2 is operated as a reset switch for resetting the electric charge which is transferred to the image signal readout section 12. That is, the fourth potential barrier is controlled by a reset signal TR applied to the fourth barrier region 22 via the gate electrode 26. Because the first electric charge transferred to the first floating diffusion region F1 is discharged to the first discharge region D1 under the control of the fourth potential barrier, the first electric charge in the first floating diffusion region F1 is reset.

The first output circuit 14 provides an image signal G1 corresponding to the potential of the first floating diffusion region F1. The first output circuit 14 provides an image signal G1 corresponding to the first electric charge transferred to the first floating diffusion region F1. The first output circuit 14 includes transistors M3 and M4, and has a so-called source follower amplifier circuit configuration. The transistor M3 is a so-called readout switch. The gate portion of the transistor M3 is connected to the first floating diffusion region F1. The drain portion of the transistor M3 is connected to the high-potential power source VDD. The source portion of the transistor M3 is connected to the drain portion of the transistor M4. The transistor M4 is a so-called selecting switch. The gate portion of the transistor M4 is connected to the driving line DL. The drain portion of the transistor M4 is connected to the source portion of the transistor M3. The source portion of the transistor M4 is connected to the image signal line GL.

The communication signal readout section 13 is provided adjacent to the photoelectric conversion region 11 in a region on the opposite side of the region where the image signal readout section 12 is provided. The communication signal readout section 13 outputs a communication signal C1 to the communication signal line CL via the third output circuit 16. The communication signal C1 corresponds to an electric charge flowing out from the photoelectric conversion region 11 to a second floating diffusion region F2.

The communication signal readout section 13 includes a second barrier region 27, the second floating diffusion region F2, a third barrier region 28, and a second discharge region (charge draining region) D2. The communication signal readout section 13 is configured so as to include a p-type or an n-type semiconductor region inside a semiconductor region 29 which is formed of an n-type semiconductor buried in the principal surface 17s of the semiconductor substrate 17. This semiconductor region 29 is spaced at only a predetermined distance L from the n-type semiconductor region KD of the photodiode PD so as to sandwich a part of the semiconductor substrate 17 formed of the p-type semiconductor therebetween. The second barrier region 27 in which the second potential barrier is set is formed between the semiconductor region 29 and the n-type semiconductor region KD. That is, the second barrier region 27 is provided adjacent to the photodiode PD. In this example, the predetermined distance L is 0.9 μM. A difference in potential between the second barrier region 27 and the photoelectric conversion region 11 is set to be lower than a difference in potential between the first barrier region 21 and the photoelectric conversion region 11 in a state in which the transfer switch is closed. The state in which the transfer switch is closed means, for example, a state in which a voltage of 0V is applied to the gate electrode 24. Further, the state in which the transfer switch is closed means a state in which a difference in potential between the first barrier region 21 and the photoelectric conversion region 11 is maximized. The semiconductor region 29 and the p-type semiconductor region AN of the photodiode PD are in contact with each other.

The second floating diffusion region F2 formed of the n+ type semiconductor is provided in proximity to the second barrier region 27 formed of the p-type semiconductor. An input terminal 16a of the second output circuit 16 is connected to the second floating diffusion region F2. The third barrier region 28 formed of the p-type semiconductor is provided in proximity to the second floating diffusion region F2. The second discharge region D2 formed of the n+ type semiconductor is provided in proximity to the third barrier region 28. The third barrier region 28 forms a third potential barrier lower than the second potential barrier. That is, a difference in potential between the third barrier region 28 and the photoelectric conversion region 11 is greater than a difference in potential between the second barrier region 27 and the photoelectric conversion region 11. An input terminal 18a of the third output circuit 18 and a high potential power source VDD are connected to the second discharge region D2.

The second output circuit 16 provides a communication signal C1 corresponding to the potential of the second floating diffusion region F2. The second output circuit 16 provides a communication signal C1 corresponding to the second electric charge flowing out to the second floating diffusion region F2. This second output circuit 16 includes transistors M5 and M6, and has a so-called source follower amplifier circuit configuration. The transistor M5 is a so-called readout switch. The gate portion of the transistor M5 is connected to the second floating diffusion region F2. The drain portion of the transistor M5 is connected to the high-potential power source VDD. The source portion of the transistor M5 is connected to the drain portion of the transistor M6. The transistor M6 is a so-called selecting switch. The gate portion of the transistor M6 is connected to the driving line DL. The drain portion of the transistor M6 is connected to the source portion of the transistor M5. The source portion of the transistor M6 is connected to the communication signal line CL.

One end of the third output circuit 18 is connected to the second discharge region D2. The other end of the third output circuit 18 is connected to the first output circuit 14. The third output circuit 18 includes a transistor M7. The gate portion of the transistor M7 is connected to the driving line DL. The drain portion of the transistor M7 is connected to the second discharge region D2. The source portion of the transistor M7 is connected to the gate portion of the transistor M3 of the first output circuit 14. In operation of the pixel 10, a predetermined control signal is applied to the gate portion of the transistor M7, to secure electric conduction between the source portion and the drain portion of the transistor M7. Due to this application of the control signal, a discriminating signal H1 corresponding to the second electric charge discharged to the second discharge region D2 is provided from the first output circuit 14.

A well 15 is provided so as to surround the photoelectric conversion region 11, the image signal readout section 12, and the communication signal readout section 13. The well 15 has a ring-like shape when viewed from a direction vertical to the principal surface 17s of the semiconductor substrate 17. The well 15 forms a high potential barrier, thereby securing electrical insulation properties between the adjacent each pixel 10 formed on the same substrate.

The insulating layer 19 is provided on the principal surface 17s of the semiconductor substrate 17. Openings 19a to 19d are provided in this insulating layer 19. The opening 19a is provided at a position corresponding to the first floating diffusion region F1. The opening 19b is provided at a position corresponding to the first discharge region D1. The opening 19c is provided at a position corresponding to the second floating diffusion region F2. The opening 19d is provided at a position corresponding to the second discharge region D2. For the insulating layer 19, for example, an oxide silicon film ($SiO_2$) may be used. However, this is not limited to an oxide silicon film, and a film formed of various materials having insulation properties may be used as the insulating layer 19.

Figure 3:
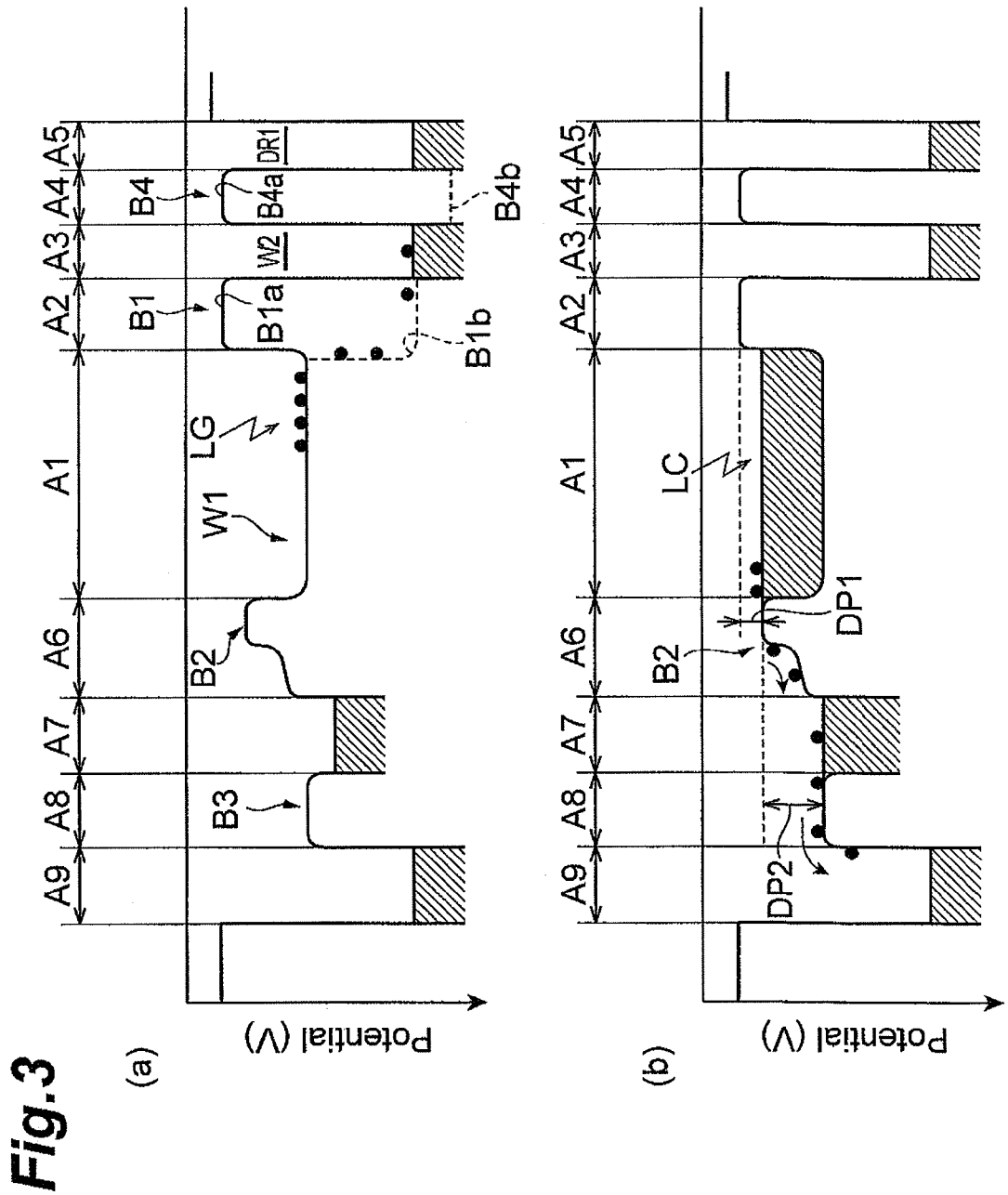
FIG. 3 are potential diagrams in section of the pixel.

FIG. 3 are potential diagrams along the section of the pixel 10 shown in FIG. 2. The black circles denote an electric charge (electrons). As shown in FIGS. 3(a) and 3(b), a range A1 corresponds to a region where the photodiode PD is formed. A range A2 corresponds to a region where the first barrier region 21 is formed. A range A3 corresponds to a region where the first floating diffusion region F1 is formed. A range A4 corresponds to a region where the fourth barrier region 22 is formed. A range A5 corresponds to a region where the first discharge region D1 is formed. A range A6 corresponds to a region where the second barrier region 27 is formed. A range A7 corresponds to a region where the second floating diffusion region F2 is formed. A range A8 corresponds to a region where the third barrier region 28 is formed. A range A9 corresponds to a region where the second discharge region D2 is formed.

A potential well W1 of the photodiode PD is formed in the range A1. A potential well W2 of the first floating diffusion region F1 is formed in the range A3. The potential well W1 is sandwiched between a first potential barrier B1 and a second potential barrier B2. That is, the photoelectric conversion region 11 is provided between the first barrier region 21 and the second barrier region 27. The first potential barrier B1 is controlled by a transfer signal TX applied to the gate electrode 24. A drain DR1 of the first discharge region D1 is formed in the range A5. A fourth potential barrier B4 is formed between the potential well W2 and the drain DR1. The fourth potential barrier B4 is controlled by a reset signal TR applied to the gate electrode 26. The second potential barrier B2 may be set, for example, according to an impurity concentration of the semiconductor forming the second barrier region 27. A third potential barrier B3 may be set, for example, based on a completely-depleted potential. Positions of the bottoms of the potentials in the second floating diffusion region F2 and the second discharge region D2 may be set, for example, according to an impurity concentration of the semiconductor forming the second floating diffusion region F2 and the second discharge region D2.

As shown in FIG. 1, the control circuit 3 generates a control signal for controlling the pixel 10. The control circuit 3 includes an image row selecting circuit 3a and a communication row selecting circuit 3b. This image row selecting circuit 3a generates a control signal for selecting a row to which an image signal G1 is output. The communication row selecting circuit 3b generates a control signal for selecting a row to which a communication signal C1 is output. A driving line DL includes, for example, one or a plurality of transfer switch driving lines, reset switch driving lines, and row selecting switch driving lines. The row selecting switch driving line includes an image row selecting switch driving line and a signal row selecting switch driving line. This control circuit 3 is divided into a plurality of blocks, to be arrayed around the pixel array 2.

The image signal processing circuit 4 includes readout circuits 4a which reads out image signals G1 from the respective pixels 10 in the pixel array 2 for each row. The image signal processing circuit 4 includes a sample-and-hold circuit and/or a noise canceling circuit, or the like. The sample-and-hold circuit holds a signal corresponding to a reset level, and a signal corresponding to a signal level. The noise canceling circuit generates a difference between a reset level and a signal level. In the image signal processing circuit 4 having such a configuration, it is possible to cancel reset noise of the pixels 10. The image signal lines GL are connected to the image signal processing circuit 4. The image signals G1 are input to the image signal processing circuit 4 via the image signal lines GL. A signal S (img) is output from the readout circuits 4a of the image signal processing circuit 4 to the signal processing circuit 6. The image signal G1 corresponds to the first electric charge transferred to the first floating diffusion region of the pixel 10.

The signal processing circuit 6 receives the signal S (img) from the readout circuits 4a. The signal processing circuit 6 includes a signal processing circuit for amplification and the like of the signal S (img). The signal processing circuit 6 generates a readout signal S (OUT) for reading out the signal S (img). The signal S (img) from the image signal processing circuit 4 may be a digital signal in a predetermined digital format.

The communication signal processing circuit 7 includes receiving circuits 7a which receive the communication signals C1 from the respective pixels 10 in the pixel array 2. The communication signal lines CL are connected to the receiving circuits 7a. The communication signal C1 corresponds to the second electric charge flowing into the second floating diffusion region F2 of the pixel 10. The receiving circuits 7a execute predetermined signal processing onto the input communication signals C1, to output a signal S (com). As the predetermined signal processing, for example, there is synchronous detection processing.

The search circuit 8 searches a position of the pixel 10 into which the communication signal light LC is incident. This search is performed based on a discriminating signal H1 corresponding to the second electric charge which is discharged to the second discharge region via the third output circuit and the first output circuit. The search circuit 8 includes a receiving circuit 8a. The receiving circuit 8a receives the discriminating signals H1 from the respective pixels 10 in the pixel array 2. The receiving circuit 8a judges whether or not the discriminating signal H1 is a signal which is generated by light onto which the communication signal C1 is superimposed (hereinafter called the communication signal light LC) based on the input discriminating signal H1. Then, when the discriminating signal H1 is a signal which is generated by the communication signal light LC, the pixel 10 corresponding to that discriminating signal H1 is specified, thereby acquiring information for specifying a position of the pixel 10 into which the communication signal light LC is incident. The positional information on the pixel is output to the communication row selecting circuit 3b.

Searching for the pixel 10 which is irradiated with the communication signal light LC is repeatedly executed at predetermined time intervals. Thereby, it is possible to track a pixel which is irradiated with the communication signal light LC in the pixel array 2. Searching for the pixel 10 may be performed so as to preferentially search around a pixel which has been specified in the past as a pixel which is irradiated with the communication signal light LC. Thereby, it is possible to efficiently search a pixel which is irradiated with the communication signal light LC, which makes it possible to speed up the search processing. Moreover, searching for the pixel 10 may be performed so as to predict a moving direction of a pixel which is next irradiated with the communication signal light LC from a result of tracking the pixel which is irradiated with the communication signal light LC, to preferentially search a region in the direction. Thereby, it is possible to more efficiently search a pixel which is irradiated with the communication signal light LC.

The timing generating circuit 9 generates a control signal, a clock signal, and the like for controlling an operation timing of the circuits included in the solid state image pick-up device 1.

The operations for reading out the image signal G1 and the communication signal C1 in the solid state image pick-up device 1 will be described. The process for reading out the image signal G1 will be described with reference to FIGS. 1 and 2, and FIG. 3(a). First, a transfer signal TX is applied to the gate electrode 24. The transfer signal TX is at a low voltage of, for example, 0V, and is applied to the gate electrode 24 from the control circuit 3 via the transfer switch driving line. At this time, the first potential barrier B1 shown by a solid line B1a is formed in the first barrier region 21. Moreover, a reset signal TR is applied to the gate electrode 26. The reset signal TR is at a positive voltage of, for example, +5V, and is applied to the gate electrode 26 from the control circuit 3 via the reset switch driving line. At this time, the height of the fourth potential barrier B4 is lowered as shown by a dashed line B4b in the fourth barrier region 22. Thereby, the electric charge existing in the first floating diffusion region F1 to the first discharge region D1 is transferred, and the first floating diffusion region F1 is reset.

Next, when light reflected from an object is incident into the pixel 10, an electric charge is generated in the photodiode PD. The electric charge is accumulated in the potential well W1 of the photodiode PD. Next, a transfer signal TX which is a predetermined positive voltage is applied to the gate electrode 24. The transfer signal TX is applied to the gate electrode 24 from the control circuit 3 via the transfer switch driving line. At this time, because the height of the first potential barrier B1 is lowered as shown by a dashed line B1b in the first barrier region 21, the first electric charge is transferred from the potential well W1 of the photodiode PD to the potential well W2 of the first floating diffusion region F1. Here, because the depth of the potential well W2 is formed to be deeper than the depth of the potential well W1, the electric charge accumulated in the potential well W1 is entirely transferred to the potential well W2. Thereby, complete transfer of the first electric charge is achieved. When the first electric charge is transferred to the first floating diffusion region F1, the potential of the first floating diffusion region F1 changes. Then, a control signal is applied to the gate portion of the transistor M4. The control signal is applied to the gate portion via the image row selecting switch driving line. Thereby the potential of the first floating diffusion region F1, as the image signal G1, to the image signal line GL via the transistors M3 and M4 of the first output circuit 14 is output. The image signal G1 is input to the readout circuit 4a of the image signal processing circuit 4 via the image signal line GL. In the image signal processing circuit 4, predetermined processing is performed onto the image signal G1, to generate a signal S (img), and the signal S (img) is output to the signal processing circuit 6. In the image signal processing circuit 4, for example, processing for canceling noise contained in the image signal G1 is performed. A signal S (out) that the S (img) is amplified by the signal processing circuit is generated in the signal processing circuit 6, and the signal S (out) is output to an external circuit.

Next, the process for reading out the communication signal C1 will be described with reference to FIG. 3(b) will be described. First, the process for searching a position of the pixel 10 into which the communication signal light LC is incident by the search circuit 8, to set the pixel 10 from which the communication signal C1 is read out will be described. When the communication signal light LC is incident into the pixel 10, the second electric charge overflows to the second floating diffusion region F2. Then, the second electric charge which is accumulated in the second floating diffusion region F2 and overflow from the second floating diffusion region F2, is discharged to the second discharge region D2. When the second electric charge is discharged to the second discharge region D2, the potential of the second discharge region D2 changes. The change in potential of the second discharge region D2 is output as a discriminating signal H1 to the search circuit 8 via the image signal line GL for each row. A change in potential of the second discharge region D2 based on the communication signal light LC is higher than a change in potential of the first floating diffusion region F1 based on the image signal light LG Therefore, in the search circuit 8, the discriminating signals H1 output from the respective pixels 10 and a predetermined voltage threshold value are compared for each pixel 10. Then, it is judged that a discriminating signal H1 having a voltage value over the predetermined voltage threshold value is a signal based on the communication signal light LC. In accordance with these processes, it is possible to search the pixel 10 into which the communication signal light LC is incident. The positional information on the pixel 10 which is judged as the pixel 10 into which the communication signal light LC is incident is output to the communication row selecting circuit 3b. The communication row selecting circuit 3b applies a control signal to the transistor M6 of the second output circuit 16 of the pixel 10 into which the communication signal light LC is incident based on the input positional information. By this application of the control signal, the electric conduction between the source portion and the drain portion of the transistor M6 is secured.

Next, the process for reading out the communication signal C1 from the pixel 10 will be described. When the communication signal light LC is started to be incident into the photodiode PD, an electric charge is generated in the photodiode PD. Because this communication signal light LC is direct light radiated from a light source such as an LED, the communication signal light LC has the optical intensity higher than the optical intensity of light reflected from an object generating an image signal G1. Therefore, when the communication signal light LC is incident into the photodiode PD, a large quantity of electric charge is accumulated in the potential well W1. The second potential barrier B2 of the second barrier region 27 is set to be lower only a predetermined difference in potential DP1 than the first potential barrier B1 of the first barrier region 22. Therefore, when a large quantity of electric charge is accumulated in the potential well W1, the second electric charge goes over the second potential barrier B2 of the second barrier region 27, to overflow from the potential well W1 to the second floating diffusion region F2. The overflowing second electric charge flows into the second floating diffusion region F2 to be accumulated. Moreover, the second electric charge overflowing from the second floating diffusion region F2 is discharged to the second discharge region D2, to form an incomplete accumulation state. At this time, the potential in the second floating diffusion region F2 drops.

Then, when the amount of the second electric charge overflowing from the photodiode PD and the amount of the second electric charge discharged from the second floating diffusion region F2 to the second discharge region D2 are balanced out, the change in potential of the second floating diffusion region F2 stops. Then, when the communication signal light LC is stopped to be incident into the photodiode PD, the generation of electric charge in the photodiode PD is stopped. Moreover, as the second electric charge is increasingly discharged from the second floating diffusion region F2 to the second discharge region D2, the potential of the second floating diffusion region F2 rises.

The potential of the second floating diffusion region F2 is output as a communication signal C1 to the communication signal line CL via the transistors M5 and M6 of the second output circuit 16. The communication signal C1 is input to the receiving circuit 7a of the communication signal processing circuit 7 via the communication signal line CL. The communication signal C1 input to the receiving circuit 7a is subjected to demodulation processing and analog-digital conversion processing in the communication signal processing circuit 7, to generate a signal S (com).

In this way, a change in potential of the second floating diffusion region F2 drops or rises in response to flashing of the communication signal light LC. This process for reading out the communication signal C1 is different from the process for reading out the image signal G1. That is, when a large quantity of electric charge is generated in the photodiode PD according to an incidence of the communication signal light LC, the second electric charge is caused to overflow to the second floating diffusion region F2, and the potential of the second floating diffusion region F2 changes. Then, when the generation of electric charge in the photodiode PD is stopped, the second electric charge in the second floating diffusion region F2 is discharged to the second discharge region D2, and the potential of the second floating diffusion region F2 changes. In accordance with such an operation, the potential of the second floating diffusion region F2 is capable of changing so as to correspond to flashing of the communication signal light LC. Accordingly, it is possible to use the pixel 10 as means for receiving a signal superimposed onto the communication signal light LC.

Here, the frequency response characteristics of the communication signal readout section 13 (refer to FIG. 2) have been confirmed by a simulation. The frequency response characteristics of the communication signal readout section 13 are based on the frequency response characteristics from the photodiode PD to the second floating diffusion region F2, and the frequency response characteristics from the second floating diffusion region F2 to the second discharge region D2. Because the capacitance of the photodiode PD is relatively large in the pixel 10, the frequency response characteristics from the photodiode PD to the second floating diffusion region F2 dominates with respect to the frequency response characteristics of the communication signal readout section 13. Therefore, the frequency response characteristics of the communication signal C1 with respect to ON/OFF of the communication signal light LC are determined according to a capacitance and an amount of photo-electric current of the photodiode PD.

Figure 4:
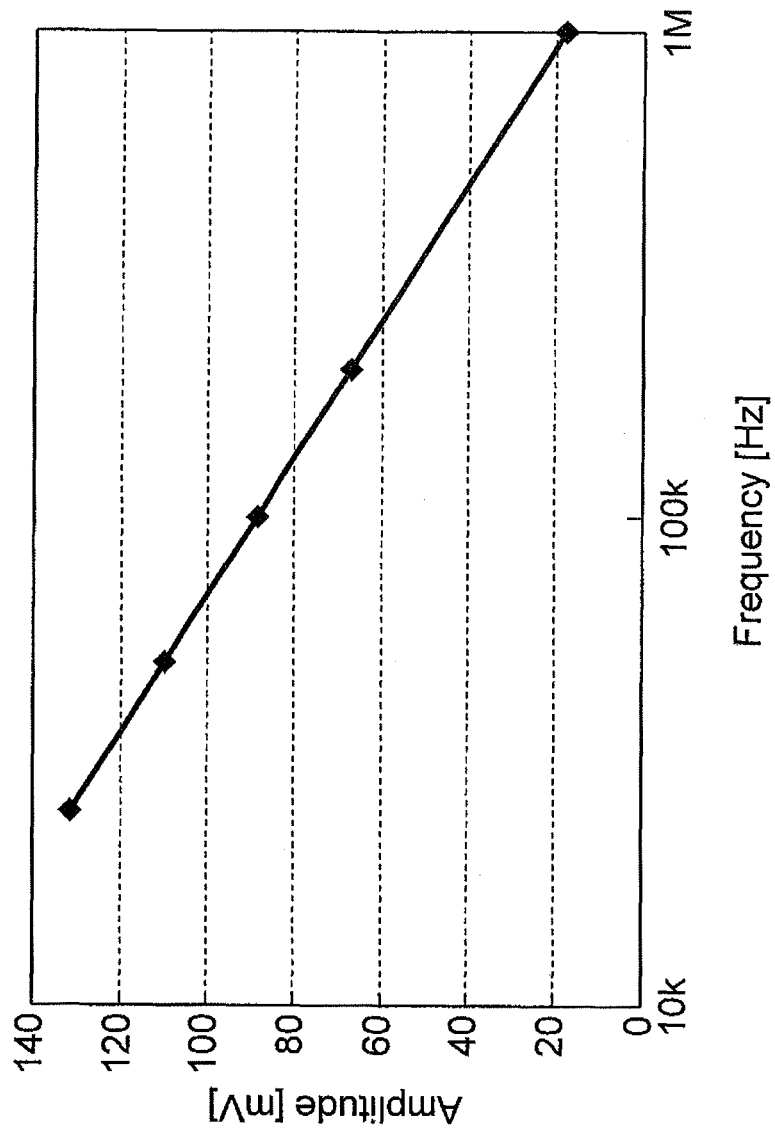
FIG. 4 is a diagram showing the frequency response characteristics of a communication signal readout section in the pixel.

FIG. 4 is a chart showing the frequency response characteristics of the communication signal readout section 13 in the pixel 10. FIG. 4 shows the frequency response characteristics when the pixel 10 is irradiated with an optical pulse with an optical intensity of 0.1 W/cm$^2$ and a wavelength of 870 nm. In confirmation of FIG. 4, the amplitude in the communication signal C1 is decreased in inverse proportion to the logarithm of the frequency of the optical pulse. For example, when the frequency of the optical pulse was 1 MHz, the amplitude in the communication signal C1 was 20 mV. It is clear that the pixel 10 having such frequency response characteristics can be used for communication at a low bit rate, and is capable of a communication operation at approximately 1 MHz.

Figure 5:
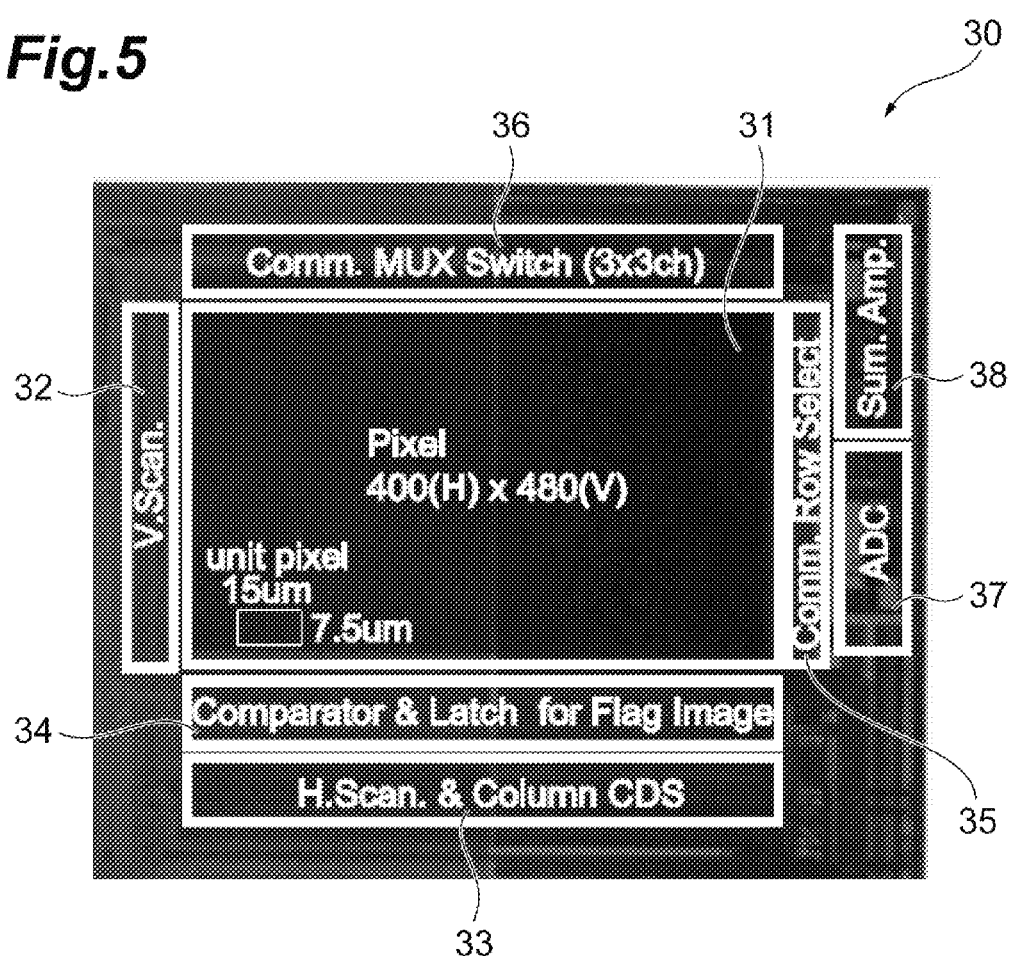
FIG. 5 is a diagram showing a semiconductor chip in which the solid state image pick-up device is realized as a semiconductor integrated element.

FIG. 5 is a diagram showing a semiconductor chip 30 in which the solid state image pick-up device 1 which is a two-dimensional image sensor is realized as a semiconductor integrated element. FIG. 5 shows a block array of the semiconductor chip 30. The semiconductor chip 30 is realized by use of a technology of a CMOS image sensor of 0.18 μm with respect to a buried photodiode. This semiconductor chip 30 has a pixel array 31 in which 400 pixels are arrayed in the horizontal direction and 480 pixels are arrayed in the vertical direction. Pixels having two output ports from which the communication signals C1 and the image signals G1 are output are arrayed in the left half of the pixel array 31. A size of each pixel is 15 μm×7.5 LPR cells and pixels for image acquisition are arrayed in the right half of the pixel array 31.

A vertical scanning circuit section 32, a horizontal scanning and column CDS circuit section 33, a comparator and latch circuit section 34, a communication row selecting circuit section 35, a multiplexer switch circuit section 36, an AD converter section 37 and an amplifier circuit section 38 are provided around the pixel array 31. The vertical scanning circuit section 32 corresponds to the image row selecting circuit 3a. The horizontal scanning and column CDS circuit section 33 corresponds to the image signal processing circuit 4. The comparator and latch circuit section 34 corresponds to the search circuit 8. The communication row selecting circuit section 35 corresponds to the communication row selecting circuit 3b. The multiplexer switch circuit section 36 corresponds to the communication signal processing circuit 7. The AD converter section 37 and the amplifier circuit section 38 correspond to the signal processing circuit 6. The image signals are read out from the horizontal scanning and column CDS circuit section 33 arrayed below the pixel array 2 in FIG. 5. The communication signals C1 are read out from the multiplexer switch circuit section 36 arrayed above the pixel array 2 in FIG. 5.

FIG. 6 are diagrams showing an example of the communication signal C1 output from the solid state image pick-up device. FIG. 6(a) shows an analog waveform N1 of the communication signal C1 output from the pixel 10. An amplitude v1 in the analog waveform N1 is about 100 mV. This communication signal C1 is a baseband signal using a random sequence, and is demodulated by an external circuit by use of a differential Manchester encoding at 2 Mbps. The LED light source that emits the communication signal light LC is driven to flash by a modulation signal. Then, the communication signal C1 of the analog waveform is converted into a digital signal by use of a high-speed analog-digital converter. FIG. 6(b) shows a digitized communication signal N2. It is clear that it is possible to achieve a communication rate of 2 Mbps by the solid state image pick-up device 1 which is an image sensor communication device (ISC) used for spatial light communication.

In accordance with the solid state image pick-up device 1, or the pixel 10 for the solid state image pick-up device 1, when the photodiode PD is irradiated with light having relatively low optical intensity such as light reflected from an object, an electric charge is generated to be accumulated in the photodiode PD. Because the accumulated electric charge does not overflow to the second floating diffusion region, and is transferred to the first floating diffusion region F1, the potential of the first floating diffusion region F1 changes. Accordingly, it is possible to acquire an image signal G1 based on the change in potential of the first floating diffusion region F1 from the first output circuit 14. On the other hand, when the photodiode PD is irradiated with the communication signal light LC having relatively high optical intensity such as direct light radiated from an LED, a large quantity of electric charge is generated in the photodiode PD. Because the second potential barrier B2 of the second barrier region 27 is set to be lower than the first potential barrier B1 of the first barrier region 21, the electric charge goes over the second potential barrier B2, to be accumulated in the second floating diffusion region F2. At this time, the potential of the second floating diffusion region F2 drops. Then, when the communication signal light LC is stopped to be incident into the photodiode PD, the generation of electric charge is stopped. Because the third potential barrier is lower than the second potential barrier, the second electric charge overflowing from the second floating diffusion region F2 is discharged to the second discharge region D2. As the second electric charge is increasingly discharged from the second floating diffusion region F2 to the second discharge region D2, the potential of the second floating diffusion region F2 rises. Accordingly, it is possible to acquire a communication signal C1 based on the change in potential of the second floating diffusion region F2 from the third output circuit 16. In this way, in accordance with the solid state image pick-up device 1, or the pixel 10 for the solid state image pick-up device, an electric charge generated in the one photodiode PD is acquired as an image signal G1 via the first floating diffusion region F1, or as a communication signal C1 via the second floating diffusion region F2. Accordingly, it is possible to spatially efficiently use the electric charge generated in the photodiode PD for acquiring two types of signals of the image signal G1 and the communication signal C1, thereby suppressing reduction in sensitivity.

In the pixel 10, because it is possible to control the first potential barrier B1 of the first barrier region 21 by a transfer signal TX, it is possible to transfer an electric charge generated in the photodiode PD at desired time intervals to the first floating diffusion region F1. Thereby, it is possible to acquire an image signal G1 based on a change in potential of the first floating diffusion region F1. Further, because the second potential barrier B2 of the second barrier region 27 is set to a desired fixed value lower than the first potential barrier B1 of the first barrier region 21, it is possible to cause the electric charge generated by the communication signal light LC to flow out to the second floating diffusion region F2. Thereby, it is possible to acquire a communication signal C1 based on a change in potential of the second floating diffusion region F2, and it is possible to acquire a communication signal corresponding to flashing of the communication signal light LC.

In the pixel 10, the electric charge generated in the photodiode PD receiving the communication signal light LC is caused to flow into the second discharge region D2 via the second floating diffusion region F2. The potential in the second discharge region D2 changes based on the electric charge flowing into the second discharge region D2. By outputting this change in potential via the second output circuit 18 and the first output circuit 14, it is possible to appropriately detect the pixel 10 used for acquiring the communication signal C1.

In the pixel 10, the transistor M7 serving as a switch is provided in the second output circuit 18. In accordance with this configuration, it is possible to electrically connect or cut off the first output circuit 14 and the second output circuit 18 by a control signal applied to the gate portion of the transistor M7. Accordingly, it is possible to prevent a parasitic capacitance from being added to the first output circuit 14.

In the solid state image pick-up device 1, the electric charge generated in the photodiode PD receiving the communication signal light LC is caused to flow into the second discharge region D2 via the second floating diffusion region F2. When the second electric charge is discharged to the second discharge region D2, the potential in the second discharge region D2 changes. It is judged whether or not the light is light onto which a communication signal C1 is superimposed based on this change in potential, by the search circuit 8. In accordance with this, it is possible to specify a position of a pixel which has received the light onto which the communication signal is superimposed.

INDUSTRIAL APPLICABILITY

In accordance with the solid state image pick-up device, and the pixel for the solid state image pick-up device, it is possible to acquire an image signal and a communication signal without reducing its sensitivity.

REFERENCE SIGNS LIST

10 ... Pixel, 11 ... Photoelectric conversion region, 21 ... First barrier region, 27 ... Second barrier region, B1 ... First potential barrier, B2 ... Second potential barrier, F1 ... First floating diffusion region, F2 ... Second floating diffusion region, ... PD Photodiode.

The invention claimed is:

1. A pixel comprising:
a photoelectric conversion region which is provided between a first barrier region forming a first potential barrier and a second barrier region forming a second potential barrier;
a first floating diffusion region which is provided adjacent to the first barrier region, and to which a first electric charge generated in the photoelectric conversion region is transferred; and
a second floating diffusion region which is provided adjacent to the second barrier region, and into which a second electric charge generated in the photoelectric conversion region flows, and in which a part of the flowing-in second electric charge is accumulated;
wherein the second potential barrier is lower than the first potential barrier;
a first output circuit which is connected to the first floating diffusion region, and provides an image signal corresponding to a potential of the first floating diffusion region; and
a second output circuit which is connected to the second floating diffusion region, and provides a communication signal corresponding to a potential of the second floating diffusion region.

2. The pixel according to claim 1, further comprising:
a third barrier region which is provided adjacent to the second floating diffusion region, to form a third potential barrier; and
a charge draining region which is provided adjacent to the third barrier region, and to which the second electric charge going over the third potential barrier, to overflow from the second floating diffusion region is discharged.

3. The pixel according to claim 2, wherein the third potential barrier is lower than the second potential barrier.

4. The pixel according to claim 2, further comprising a third output circuit whose one end is connected to the charge draining region, and whose other end is connected to the first output circuit.

5. The pixel according to claim 4, wherein a switch is provided between the one end and the other end of the third output circuit.

6. The pixel according to claim 1, wherein
the first potential barrier is controlled by a transfer signal applied to the first barrier region when transferring the first electric charge,
the second potential barrier is set to a desired fixed value,
the image signal corresponding to the first electric charge transferred to the first floating diffusion region is output, and
the communication signal corresponding to the second electric charge flowing into the second floating diffusion region is output.

7. A solid state image pick-up device comprising:
a pixel array having a plurality of pixels which are two-dimensionally arrayed;
a readout circuit which reads out an image signal from the pixel array;
a receiving circuit which receives a communication signal from the pixel array, and
a control circuit which generates a control signal for controlling the respective pixels;
wherein the pixel includes
a photoelectric conversion region which is provided between a first barrier region forming a first potential barrier and a second barrier region forming a second potential barrier,
a first floating diffusion region which is provided adjacent to the first barrier region, and to which a first electric charge generated in the photoelectric conversion region is transferred,
a second floating diffusion region which is provided adjacent to the second barrier region, and into which a second electric charge generated in the photoelectric conversion region flows, and in which a part of the flowing-in second electric charge is accumulated,
a first output circuit which is connected to the first floating diffusion region, and provides the image signal corresponding to a potential of the first floating diffusion region, and
a second output circuit which is connected to the second floating diffusion region, and provides the communication signal corresponding to a potential of the second floating diffusion region, and
the second potential barrier is set to be lower than the first potential barrier,
the image signal corresponds to the first electric charge transferred to the first floating diffusion region, and
the communication signal corresponds to the second electric charge transferred to the second floating diffusion region.

8. The solid state image pick-up device according to claim 7, further comprising a search circuit which reads out a discriminating signal from the pixel array, to search the pixel into which light onto which a signal is superimposed is incident based on the discriminating signal,
the pixel includes a third barrier region forming a third potential barrier, a charge draining region which is provided adjacent to the third barrier region, and to which the second electric charge going over the third potential barrier, to overflow from the second floating diffusion region is discharged, and a third output circuit whose one end is connected to the charge draining region, and whose other end is connected to the first output circuit, and
the search circuit reads out the discriminating signal corresponding to the second electric charge which is discharged to the charge draining region via the third output circuit and the first output circuit.

9. A pixel comprising:
a photoelectric conversion region which is provided between a first barrier region forming a first potential barrier and a second barrier region forming a second potential barrier;
a first floating diffusion region which is provided adjacent to the first barrier region, and to which a first electric charge generated in the photoelectric conversion region is transferred; and
a second floating diffusion region which is provided adjacent to the second barrier region, and into which a second electric charge generated in the photoelectric conversion region flows, and in which a part of the flowing-in second electric charge is accumulated;

wherein the second potential barrier is lower than the first potential barrier;

the first potential barrier is controlled by a transfer signal applied to the first barrier region when transferring the first electric charge, the second potential barrier is set to a desired fixed value, the image signal corresponding to the first electric charge transferred to the first floating diffusion region is output, and the communication signal corresponding to the second electric charge flowing into the second floating diffusion region is output.

10. The pixel according to claim 9, further comprising:

a first output circuit which is connected to the first floating diffusion region, and provides an image signal corresponding to a potential of the first floating diffusion region; and a second output circuit which is connected to the second floating diffusion region, and provides a communication signal corresponding to a potential of the second floating diffusion region.

11. The pixel according to claim 10, further comprising:

a third barrier region which is provided adjacent to the second floating diffusion region, to form a third potential barrier; and a charge draining region which is provided adjacent to the third barrier region, and to which the second electric charge going over the third potential barrier, to overflow from the second floating diffusion region is discharged.

12. The pixel according to claim 11, wherein the third potential barrier is lower than the second potential barrier.

13. The pixel according to claim 11, further comprising a third output circuit whose one end is connected to the charge draining region, and whose other end is connected to the first output circuit.

14. The pixel according to claim 13, wherein a switch is provided between the one end and the other end of the third output circuit.

* * * * *